US011887682B2

(12) United States Patent
Li

(10) Patent No.: US 11,887,682 B2
(45) Date of Patent: Jan. 30, 2024

(54) ANTI-FUSE MEMORY CELL CIRCUIT, ARRAY CIRCUIT AND READING AND WRITING METHOD THEREOF

(71) Applicant: ChangXin Memory Technologies, Inc., Hefei (CN)

(72) Inventor: Xin Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 151 days.

(21) Appl. No.: 17/432,808

(22) PCT Filed: Feb. 22, 2020

(86) PCT No.: PCT/CN2020/076311
§ 371 (c)(1),
(2) Date: Aug. 20, 2021

(87) PCT Pub. No.: WO2021/056958
PCT Pub. Date: Apr. 1, 2021

(65) Prior Publication Data
US 2022/0122680 A1    Apr. 21, 2022

(30) Foreign Application Priority Data
Sep. 29, 2019   (CN) ............................. 201910931356

(51) Int. Cl.
*G11C 17/16*    (2006.01)
*G11C 17/06*    (2006.01)
*G11C 17/18*    (2006.01)

(52) U.S. Cl.
CPC .............. *G11C 17/06* (2013.01); *G11C 17/18* (2013.01)

(58) Field of Classification Search
CPC ................................ G11C 17/16; G11C 17/18
(Continued)

(56) References Cited

U.S. PATENT DOCUMENTS

2002/0136076 A1   9/2002  Kleveland et al.
2011/0273950 A1*  11/2011  Banerjee ................. G11C 17/16
                                              365/225.7
(Continued)

FOREIGN PATENT DOCUMENTS

CN         1664955 A     9/2005
CN       102956261 A     3/2013
(Continued)

OTHER PUBLICATIONS

PCT/CN2020/076311 International Search Report dated Jul. 1, 2020, English Translation.
(Continued)

*Primary Examiner* — Huan Hoang
(74) *Attorney, Agent, or Firm* — Alston & Bird LLP

(57) ABSTRACT

An anti-fuse memory unit circuit, an array circuit and a reading and writing method are disclosed. The advantages of the device and method include: 1. the anti-fuse memory cell circuit is a pure combinational circuit, compared to time sequence circuit, after a delay of a certain time, this disclosed device closes all paths and stops the logic action of entire circuit, thus lowering the static power consumption to approximately 0; 2. this circuit constituted two positive feedback loops through the design of a switch and a logic calculation module, which enables its readout circuit to read "0" or "1" more reliably; 3. this circuit can eliminate a complicated timing sequence control part, even output the anti-fuse codes directly without latching the readout circuit output OUTA/OUTB; 4. this circuit layout is flexible.

15 Claims, 4 Drawing Sheets

(58) Field of Classification Search
USPC .......................................................... 365/96
See application file for complete search history.

(56) References Cited

U.S. PATENT DOCUMENTS

2013/0063999 A1   3/2013   Agam et al.
2014/0022855 A1   1/2014   Jang et al.

FOREIGN PATENT DOCUMENTS

| CN | 103714849 A | 4/2014 |
| CN | 103730163 A | 4/2014 |
| CN | 210271793 U | 4/2020 |
| WO | WO 2021/056958 A1 | 4/2021 |

OTHER PUBLICATIONS

PCT/CN2020/076311 Written Opinion of the International Searching Authority dated Jul. 1, 2020.
EP 20869974.4 Communication pursuant to Article 94(3) EPC dated May 31, 2023.

* cited by examiner

ANTI-FUSE MEMORY CELL CIRCUIT, ARRAY CIRCUIT AND READING AND WRITING METHOD THEREOF

CROSS REFERENCES TO RELATED APPLICATIONS

This application is a national phase entry of International Application No. PCT/CN2020/076311 filed on Feb. 22, 2020, which claims the benefit of priority to CN Patent Application CN 201910931356.X filed on Sep. 29, 2019, both entitled "ANTI-FUSE MEMORY CELL CIRCUIT, ARRAY CIRCUIT AND READING AND WRITING METHOD THEREOF", the contents of which are incorporated herein by reference in its entirety.

TECHNICAL FIELD

The invention relates to the field of integrated circuits, in particular to an anti-fuse memory cell circuit, an array circuit and a reading and writing method thereof.

BACKGROUND

One Time Programmable (OTP) memory can store data in multiple OTP cells having two states of unprogrammed or programmed. An OTP unit may include a fuse or an anti-fuse, and once the fuse or the anti-fuse is programmed, the stored data is permanent. Because of this feature, OTP memory is used in various applications to store data. In DRAM, OTP is used to control the opening or closing of redundancy (redundancy) memory cells. For example, when a memory cell corresponding to a word line is defective, the corresponding OTP cell will be programmed (the output state of the OTP cell is changed from "0" to "1"), the DRAM control circuit will close the reading and writing of this memory unit, and open the reading and writing of a memory unit in the redundant area. At this time, the memory unit corresponding to the redundant area has fully replaced the defective memory unit, and thus the DRAM defects are repaired.

The current one-time programmable memory has the following problems: 1. the one-time programmable memory device has a large static power consumption; 2. the one-time programmable memory readout circuit has poor reliability; 3. the one-time programmable memory control circuit is complicated; and 4. the one-time programmable memory device layout is not flexible.

Therefore, how to overcome the above-mentioned problems has become an urgent technical problem to be solved at present.

SUMMARY the present invention provides an anti-fuse memory cell circuit, an array circuit and a reading and writing method thereof, which have lower static power consumption, high reliability of the readout circuit, simple structure and flexible wiring.

The anti-fuse memory cell circuit includes:
anti-fuse device;
a switch module, coupled to the anti-fuse device;
a selection module, coupled to the switch module;
control modules, respectively coupled to the anti-fuse device and the switch module;

wherein, the control module is configured to switch the on-off mode of the switch module according to the breakdown state of the anti-fuse device.

Further, the anti-fuse device has a first end and a second end, the switch module includes a first switch unit and a second switch unit, and both the first switch unit and the second switch unit have a first end, a second end and a control end, and the control ends are all coupled to the control module, the second ends are all coupled to the selection module, and the first end of the first switch unit is coupled to the inverter. The first end of the fuse device, and the first end of the second switch unit is coupled to the second end of the anti-fuse device.

Further, the switch module further includes a third switch unit. The third switch unit has a first end, a second end and a control end. The first end of the third switch unit is coupled to the anti-fuse device, the second end of the third switch unit is coupled to the ground signal, and the control end of the third switch unit is coupled to the control module.

Further, the selection module includes a bit line selection unit and a word line selection unit. Both the bit line selection unit and the word line selection unit have a first end, a second end and a control end. The control terminal is coupled to the bit line, the first terminal of the bit line selection unit is coupled to the second terminal of the second switch unit, the second terminal of the bit line selection unit is coupled to the ground signal, the control end of the word line selection unit is coupled to the word line, the first end of the word line selection unit is coupled to the second end of the first switch unit, and the second end of the word line selection unit is coupled to a power signal.

Further, the anti-fuse memory cell circuit further includes a current supply module having a first end and a second end. The first end of the current supply module is coupled to the power signal, and the second end is coupled to the second end of the word line select unit.

Further, the control module includes a control unit, which control unit has an input terminal and an output terminal. The input terminal is coupled to the first terminal of the anti-fuse device, write enable signal, read enable signal, read delay signal is enabled, and the output terminal is coupled to the switch module.

The control module further includes an amplifying unit having an input terminal and an output terminal. The input terminal is coupled to the first terminal of the anti-fuse device, and the output terminal is coupled to the input terminal of the control unit. The amplifying unit is used to amplify the signal of the first terminal of the anti-fuse device.

Further, the control module includes a delay unit having an input terminal and an output terminal. The read enable signal is also coupled to the input terminal of the delay unit, and the output terminal of the delay unit is coupled to the control unit, and the delay unit is used to delay the read enable signal to form the read enable delay signal.

The present invention also provides an anti-fuse memory cell array circuit, which includes:
at least one control module;
at least one anti-fuse memory cell circuit, the anti-fuse memory cell circuit includes:
an anti-fuse device:
a switch module, coupled to the anti-fuse device;
a selection module, coupled to the switch module;
here the control module is respectively coupled to the anti-fuse device and the switch module of the anti-fuse memory cell circuit, and the control module is configured to switch the on-off anti-fuse device mode according to the breakdown state of the anti-fuse device.

Further, the control module is a master control module, which is respectively coupled to the anti-fuse device and the switch module of each of the anti-fuse memory cell circuits.

Further, the master control module includes a control unit having an input terminal and an output terminal, and the input terminal is respectively coupled to the first of the anti-fuse device of each of the anti-fuse memory cell circuits. The output terminal is respectively coupled to the switch module of each of the anti-fuse memory cell circuits. The output terminal is a write enable signal, a read enable signal, and a read enable delay signal.

Further, the anti-fuse memory cell array circuit includes a plurality of the control modules, and one control module is coupled to at least the anti-fuse device and the switch module of one of the anti-fuse memory cell circuits.

Further, the anti-fuse memory cell array circuit further includes at least one current supply module, and at least some of the anti-fuse memory cell circuits share the same current supply module.

Further, the anti-fuse memory cell array circuit includes at least one word line selection unit, and at least some of the anti-fuse memory cell circuits share the same word line selection unit.

The present invention also provides a method for reading and writing an anti-fuse memory cell circuit as described above, which includes:
during programming: the control module controls the switch module to be in the first state to perform a write operation on the anti-fuse device;
in standby: the control module controls the switch module to be in the second state to reduce the power consumption of the anti-fuse device;
during normal operation: the control module controls the switch module to be in the third state to perform a read operation on the anti-fuse device.

Further, during programming, the selection module is turned on, in standby, the selection module is turned off, and in normal operation, the selection module is turned on.

Further, the anti-fuse device has a first end and a second end. The switch module includes a first switch unit and a second switch unit, and both the first switch unit and the second switch unit have a first end, a second end and a control end. The control ends are all coupled to the control module, the second ends are all coupled to the selection module, and the first end of the first switch unit is coupled to the inverter and a first end of a fuse device, and a first end of the second switch unit is coupled to a second end of the anti-fuse device.

The first state of the switch module is when the first switch unit and the second switch unit are open.

The second state of the switch module is when the first switch unit and the second switch unit are off.

The third state of the switch module is: if the anti-fuse device is not broken down, the first switch unit is turned on and the second switch unit is turned off; if the anti-fuse device is broken down, then the first switch unit is closed, and the second switch unit is opened.

Further, the switch module includes a third switch unit. The third switch unit has a first end, a second end and a control end, and the first end of the third switch unit is coupled to the anti-fuse device, the second end of the third switch unit is coupled to a ground signal, and the control end of the third switch unit is coupled to the control module.

The first state of the switch module is: the first switch unit and the second switch unit are open, and the third switch unit is closed.

The second state of the switch module is: the first switch unit and the second switch unit are closed, and the third switch unit is open.

The third state of the switch module is: if the anti-fuse device is not broken down, the control module controls the first switch unit to turn on, the second switch unit to turn off, and the third switch unit closed; if the anti-fuse device is broken down, the control module controls the first switching unit to close, the second switching unit to open, and the third switching unit to close.

The advantages of the present invention are:
1. The anti-fuse memory cell circuit is a pure combinational circuit. Compared with a time sequence circuit, after a delay of a certain time, after the read and write operation is completed, all paths are closed, and the entire circuit stops logic action, and the static power consumption is even lower to approximately 0.
2. The anti-fuse memory cell circuit o essentially forms two positive feedback loops through the design of switches and logic operation modules, so that the readout circuit can read "0" or "1" more reliably.
3. The anti-fuse memory unit circuit can save complicated timing control parts, and even the output OUTA/OUTB of the readout circuit can be directly used as the code output of the anti-fuse without being latched.
4. The circuit layout of the anti-fuse memory cell is flexible.

It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

The specific implementations of the anti-fuse memory cell circuit, the array circuit and the reading and writing method thereof provided by the present invention will be described in detail below with reference to the accompanying drawings.

Figure 1:
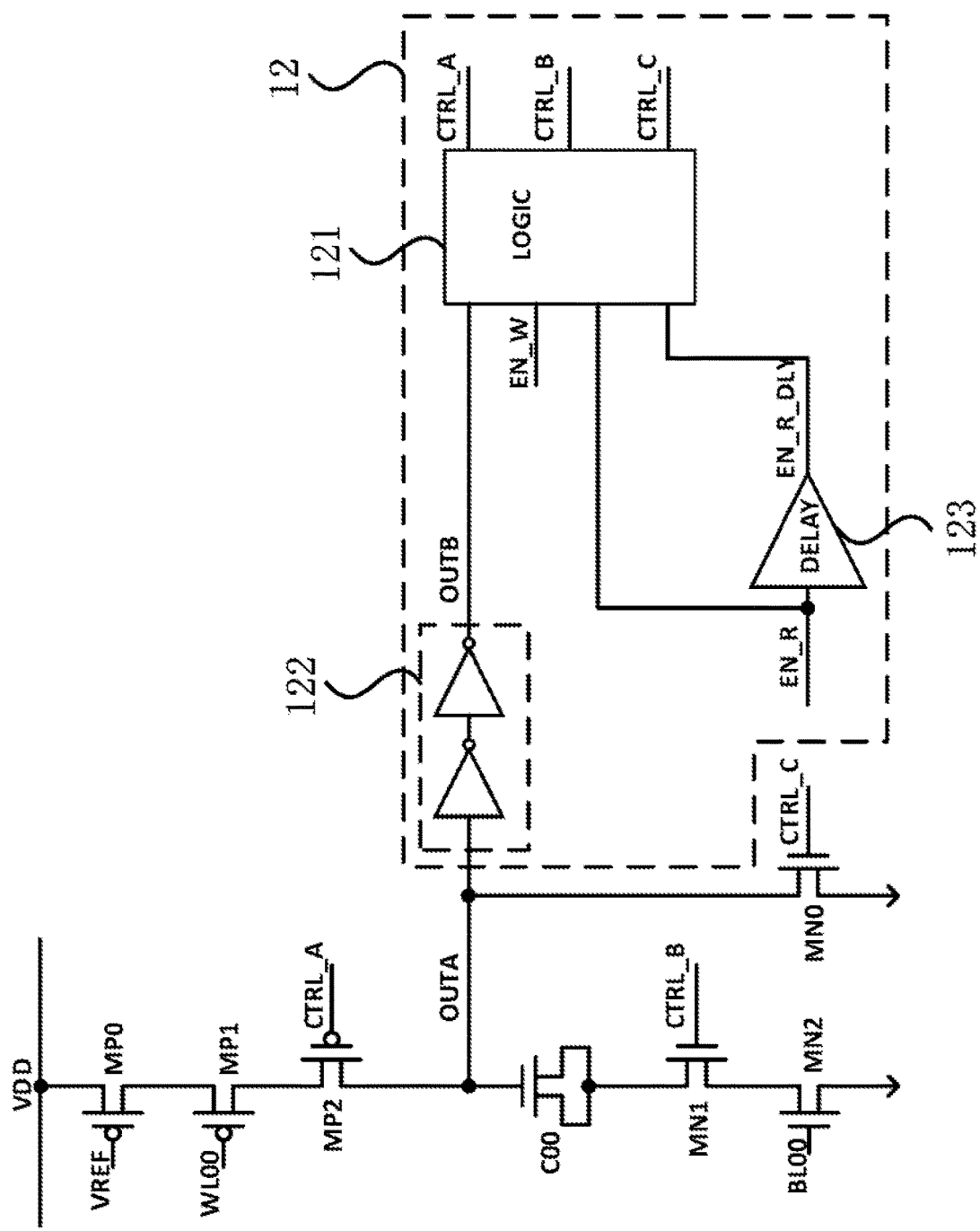
FIG. 1 is a circuit diagram of a specific embodiment of the anti-fuse memory cell circuit of the present invention.

The anti-fuse memory unit circuit includes an anti-fuse device; a switch module, which is coupled to the anti-fuse device; a selection module, which is coupled to the switch module; a control module, which is respectively coupled to the anti-fuse device and the switch module, wherein the control module is used to switch the on-off mode of the switch module according to the breakdown state of the anti-fuse device. The anti-fuse memory unit circuit of the present invention can control the opening and closing of the switch module according to the output of the anti-fuse device (ie, the memory state of the anti-fuse memory unit), thereby achieving the purpose of saving power consumption. FIG. 1 is a circuit diagram of one embodiment of the anti-fuse memory cell circuit of the present invention. Please refer to FIG. 1, the anti-fuse memory cell circuit includes an anti-fuse device C00, a switch module, a selection module, and a control module 12.

The anti-fuse device C00 has a first end and a second end. During programming, if the anti-fuse device C00 is broken down, the on-resistance is approximately 0 ohm; if the anti-fuse device C00 is not broken down, the on-resistance is approximately an infinite resistance. That is to say, the anti-fuse device C00 is non-conductive when it is not activated, but becomes a conductor after activation (breakdown), forming an electrical connection, and can selectively allow two devices or chips that are originally electrically isolated to make electrical connections and provide different resistance values for logic operations.

The switch module is coupled to the anti-fuse device C00. The switch module includes a first switch unit MP2 and a second switch unit MN1. The first switch unit MP2 and the second switch unit MN1 each has a first terminal, a second terminal and a control terminal. In this exemplary embodiment, the first switch unit MP2 is a P-type transistor and the second switch unit MN1 is an N-type transistor.

The control ends of the first switch unit MP2 and the second switch unit MN1 are both coupled to the control module 12. Specifically, the control terminal of the first switch unit MP2 is coupled to the first control signal CTRL_A of the control module 12, and the control terminal of the second switch unit MN1 is coupled to the second control signal CTRL_B of the control module 12.

The second ends of the first switch unit MP2 and the second switch unit MN1 are both coupled to a selection module. Specifically, the second end of the first switch unit MP2 is coupled to the word line selection unit MP1 of the selection module, and the second end of the second switch unit MN1 is coupled to the bit line of the selection module select cell MN2.

The first end of the first switch unit MP2 is coupled to the first end of the anti-fuse device C00, and the first end of the second switch unit MN1 is coupled to the second end of the anti-fuse device C00.

After the readout circuit of the anti-fuse memory cell reads the programming result, if the anti-fuse device C00 is broken down, the pull-up of the anti-fuse memory cell is turned off. If the anti-fuse device C00 is not broken, the pull-up of the anti-fuse memory cell is maintained. After the readout circuit of the anti-fuse memory cell reads the programming result, if the anti-fuse device C00 is broken down, the pull-down of the anti-fuse memory cell is maintained; if the anti-fuse device C00 is not broken down, then turn off the pull-down of the anti-fuse memory cell.

Further, the switch module further includes a third switch unit MN0, and the third switch unit MN0 has a first terminal, a second terminal, and a control terminal. The first end of the third switch unit MN0 is coupled to the first end of the anti-fuse device C00, the second end of the third switch unit MN0 is coupled to the ground signal, and the control terminal of the third switch unit MN0 is coupled to the third control signal CTRL_A of the control module 12. In this embodiment, the third switch unit MN0 is an N-type transistor. The third switch unit MN0 is used to pull the first-level output node OUTA of the anti-fuse memory unit to ground when the one-time programmable memory cell is not working, and is also used to limit the first-level output node OUTA to initial working state when the one-time programmable memory cell is working.

The selection module includes a bit line selection unit MN2 and a word line selection unit MP1. Both the bit line selection unit MN2 and the word line selection unit MP1 each has a first end, a second end and a control end. Herein, the bit line selection unit MN2 may be an N-type transistor, and the word line selection unit MP1 may be a P-type transistor.

The control terminal of the bit line selection unit MN2 is coupled to the bit line BL00, the first terminal of the bit line selection unit MN2 is coupled to the second terminal of the second switch unit MN1, and the bit line selection unit MN2 the second end of is coupled to the ground signal. The control end of the word line selection unit MP1 is coupled to the word line WL00, the first end of the word line selection unit MP1 is coupled to the second end of the first switch unit MP2, and the second end of the word line selection unit MP1 is coupled to the power signal.

During programming, the bit line selection unit MN2 can control all the on-off of the anti-fuse memory cell and play a role in protecting the anti-fuse device C00.

Further, the anti-fuse memory cell circuit further includes a current supply module MP0, which has a first end and a second end, and the first end of the current supply module MP0 is coupled to the power signal, and the second end is coupled to all the second end of the word line selection unit MP1. That is, the second end of the word line selection unit MP1 is coupled to a power signal through the current supply module MP0. The current supply module MP0 is used as a mirror current source. During programming, the current supply module MP0 can control the magnitude of the current flowing through the anti-fuse device C00. In normal operation, the current supply module MP0 can control the anti-fuse device C00 in its pull-up capability. In this device, the current supply module MP0 can be a P-type transistor.

The control module 12 includes a control unit 121, an amplification unit 122 and a delay unit 123.

The control unit 121 is used to receive signals and output control signals. Exemplarily, the control unit 121 has an input terminal and an output terminal. The input terminal is coupled to the first terminal of the anti-fuse device C00 through the amplifying unit 122, a write enable signal En_W. and a read enable signal En_R, and the read enable delay signal En_R_DLY. The output terminal is coupled to the switch module, and outputs a first control signal CTRL_A, a second control signal CTRL_B, and a third control signal CTRL_C. The first control signal CTRL_A is coupled to the control terminal of the first switch unit MP2, the second control signal CTRL_B is coupled to the control terminal of the second switch unit MN1, and the third control signal CTRL_C is coupled to the control terminal of the third switch unit MN0.

The amplifying unit 122 has an input terminal and an output terminal. The input terminal is coupled to the first-level output node OUTA of the anti-fuse device C00 for connecting the first-level output node OUTA of the anti-fuse device C00. The state amplification is the state of the secondary output OUTB, which can avoid logic errors in the subsequent digital circuits and improve the reliability of the readout circuit. The output terminal is coupled to the input terminal of the control unit 121 to input the secondary output OUTB of the anti-fuse device C00 to the input terminal of the control unit 121. In this exemplary implementation, the amplifying unit 122 is composed of two inverters.

The delay unit 123 is used to generate the read enable delay signal En_R_DLY. Specifically, in addition to being coupled to the control unit 121, the read enable signal En_R is also coupled to the delay unit 123. The delay unit 123 delays the read enable signal En_R and then outputs the Read enable delay signal En_R_DLY. The delay unit 123 may be formed by connecting an even number of inverters in series, or the delay unit 123 may be an RC delay circuit. The delay time Td includes at least 4 inverter delays, and the amplifying unit 122 can amplify OUTA during Td period.

The present invention also provides an exemplary implementation of the method for reading and writing the above anti-fuse memory cell circuit. Please refer to Table 1:

TABLE 1

| EN_W | EN_R | EN_R_DLY | OUTA | OUTB | CTRL_A | CTRL_B | CTRL_C |
|---|---|---|---|---|---|---|---|
| 1 | 0 | 0 | X | X | 0 | 1 | 0 |
| 0 | 0 | 0 | X | X | 1 | 0 | 1 |
| 0 | 1 | 0 | X | X | 0 | 1 | 0 |
| 0 | 1 | 1 | 0 | 0 | 1 | 1 | 0 |
| 0 | 1 | 1 | 1 | 1 | 0 | 0 | 0 |

The method of programming is that the control module controls the switch module to be in the first state to perform a write operation on the anti-fuse device. Examples are as follows:

When the write enable signal EN_W=1 and the read enable signal EN_R=0, the first control signal CTRL_A=0 (the first switch tube MP2 is turned on) and the second control signal CTRL_B=1 (the second switch tube MN1 is turned on)), the third control signal CTRL_C0 (the third switch tube MN0 is turned off), VDD is a high voltage; if the word line WL00 is "0" and the bit line BL00 is "I", then the anti-fuse device C00 breaks down. In other cases, the anti-fuse device C00 has not been broken down, then the on-resistance is approximately infinite olhms.

The standby method is that the control module controls the switch module to be in the second state so as to reduce the power consumption of the anti-fuse device. Examples are as follows:

When the write enable signal EN_W=0 and the read enable signal EN_R=0, the first control signal CTRL_A=1 (the first switch tube MP2 is turned oft) and the second control signal CTRL_B=0 (the second switch tube MN1 is turned off)), the third control signal CTRL_C=1 (the third switch tube MN0 is turned on), and VDD is the normal voltage. At this time the static power consumption of the anti-fuse memory cell is approximately 0, and the default output of OUTB is "0".

The method during normal operation is that the control module controls the switch module to be in the third state to perform a read operation on the anti-fuse device. Examples are as follows:

1. When word line WL00=0, bit line BL00=1, VDD is the normal voltage, write enable signal EN_W=0, read enable signal EN_R=0, read enable delay signal EN_R_DLY=0, then the first control signal CTRL_A=1 (the first switch tube MP2 is turned off), the second control signal CTRL_B=0 (the second switch tube MN1 is turned off), and the third control signal CTRL_C=1 (the third switch tube MN0 is turned on). 2. When word line WL00=0, bit line BL00=1, VDD is the normal voltage, write enable signal EN_W=0, read enable signal EN_R=1, read enable delay signal EN_R_DLY=0, then the first control signal CTRL_A=0 (the first switch tube MP2 is turned on), the second control signal CTRL_B=1 (the second switch tube MN1 is turned on), and the third control signal CTRL_C0 (the third switch tube MN0 is turned off); if the anti-fuse device C00 is not broken down, the on-resistance of the anti-fuse device C00 is approximately infinite ohms. The first P-type transistor MP0, the first selection transistor MP1 and the first switch tube MP2 will pull OUTA up to "1"; if the anti-fuse device C00 is broken down, the on-resistance of the anti-fuse device C00 is approximately 0 ohm, and the second switch tube MN1 and the second selection transistor MN2 will keep OUTA at "0". 3. When word line WL00=0, bit line BL00=1, VDD is the normal voltage, write enable signal EN_W=0, read enable signal EN_R=1, read enable delay signal EN_R_DLY=, if OUTB=OUTA=1, the first control signal CTRL_A=0 (the first switch tube MP2 is turned on), the second control signal CTRL_B=0 (the second switch tube MN1 is turned off), and the third control signal CTRL_C=0 (the third switch tube MN0 is turned off); If OUTB=OUTA=0, the first control signal CTRL_A=1 (the first switch tube MP2 is turned oft), the second control signal CTRL_B=1 (the second switch tube MN1 is turned on), and the third control signal CTRL_C=0 (the first The three switch tube MN0 is closed).

The anti-fuse memory unit circuit of the present invention is a pure combinational circuit. Compared with a time sequential circuit, all paths are closed after the Td delay, and the whole circuit has stopped any logic action, leading to lower static power consumption, at approximately zero power consumption. The inventive anti-fuse memory cell circuit essentially forms two positive feedback loops through the design of switches and logic operation modules so that the readout circuit can read "0" or "1" more reliably; at the same time, the present inventive anti-fuse memory unit circuit can save the complicated timing sequence control part, and even can output the OUTA/OUTB of the readout circuit directly as the code output of the anti-fuse device without latching it.

Further, to realize the control of the anti-fuse memory unit circuit of the present invention, the internal code structure of the logic operation unit LOGIC circuit is as follows:

CTRL_A=(!EN_W) && ((!EN_R) && (!EN_R_DLY)||EN_R && EN_R_DLY && (!OUTB))

CTRL_B=EN_W && (!EN_R) && (!EN_R_DLY)||(!EN_W) && EN_R && ((!EN_R_DLY)||EN_R_DLY && (!OUTB))

CTRL_C=(!EN_W)&& (!EN_R)

Figure 2:
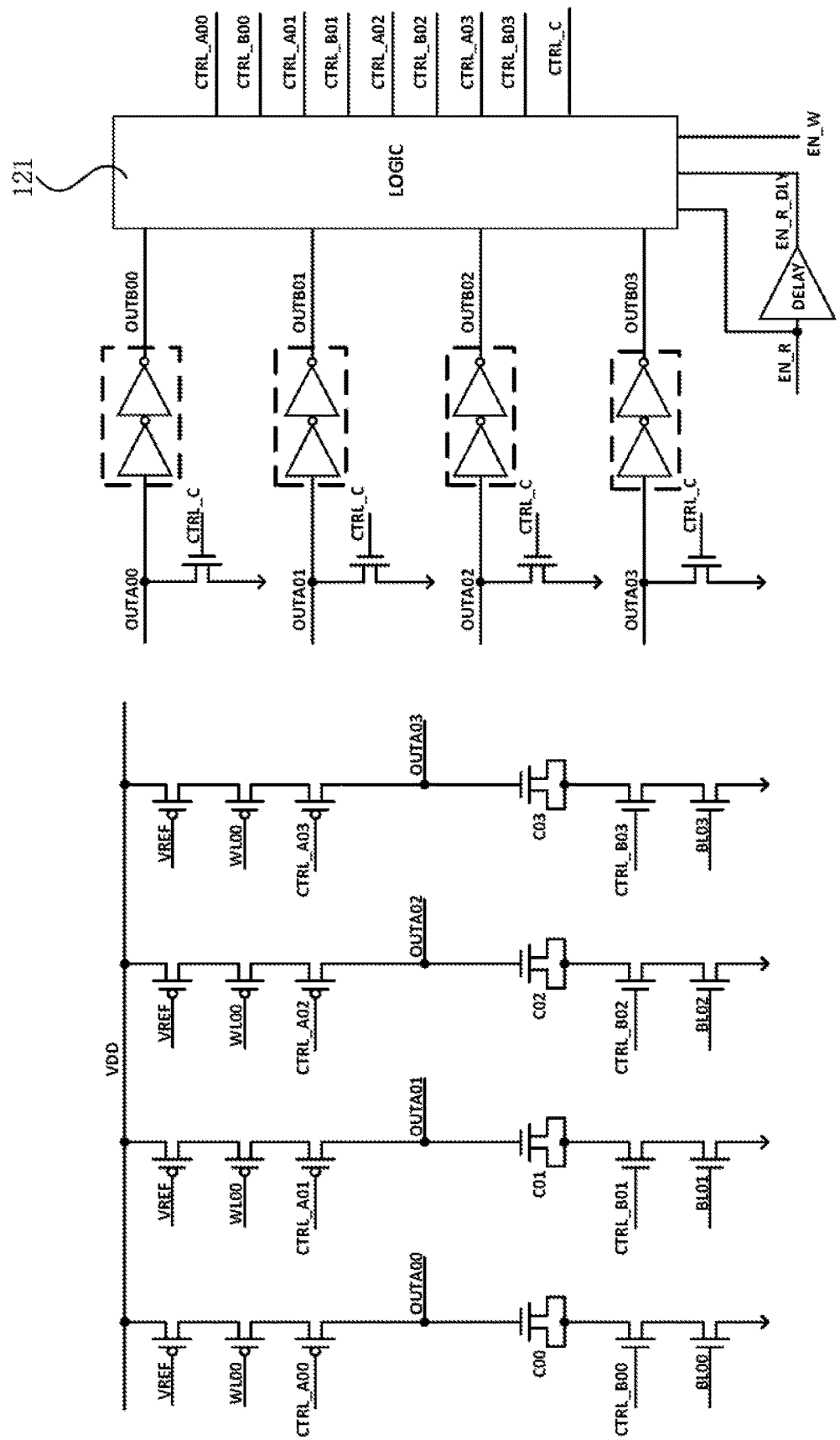
FIG. 2 is a circuit diagram of a first specific embodiment of an anti-fuse memory array circuit.

The present invention also provides a first specific implementation of the anti-fuse memory array circuit. FIG. 2 is a circuit diagram of the first exemplary embodiment of the anti-fuse memory array circuit. Please refer to FIG. 2. The anti-fuse memory array circuit includes at least one control module and a plurality of anti-fuse memory cell circuits. The anti-fuse memory unit circuit includes: an anti-fuse device, a switch module, and a selection module. The anti-fuse device, switch module, and selection module are the same as the anti-fuse device, switch module, and switch module of the anti-fuse memory unit circuit. The selection module structure is the same. The control module is respectively coupled to the anti-fuse device and the switch module of the anti-fuse memory unit circuit, and the control module is configured to switch on-off mode of the switch module of the anti-fuse device, according to the breakdown state of the anti-fuse device.

In this embodiment, the control module is a master control module, which is respectively coupled to the anti-fuse memory device and the switch module of each of the anti-fuse memory unit circuits. The overall control module includes a control unit 121, the input of the control unit is coupled to the write enable signal EN_W, read enable signal EN_R, and read enable delay signal EN_R_DLY and each of the first end of the anti-fuse device C00. That is, the anti-fuse memory cell circuit shares the write enable signal EN_W, the read enable signal EN_R, and the read enable delay signal EN_R_DLY to reduce the number of input lines, thereby reducing the area. Further, the output terminal of the control unit outputs a control signal, the control signal is coupled to the third switch unit MN0 of the anti-fuse memory unit, that is, the anti-fuse memory unit circuit shares the control unit. The third control signal CTRL_C is used to reduce the number of control lines, thereby reducing the area. For logic operation circuits, the internal pure combinational logic can continue to be optimized to reduce the number of logic gates, thereby reducing the area.

Figure 3:
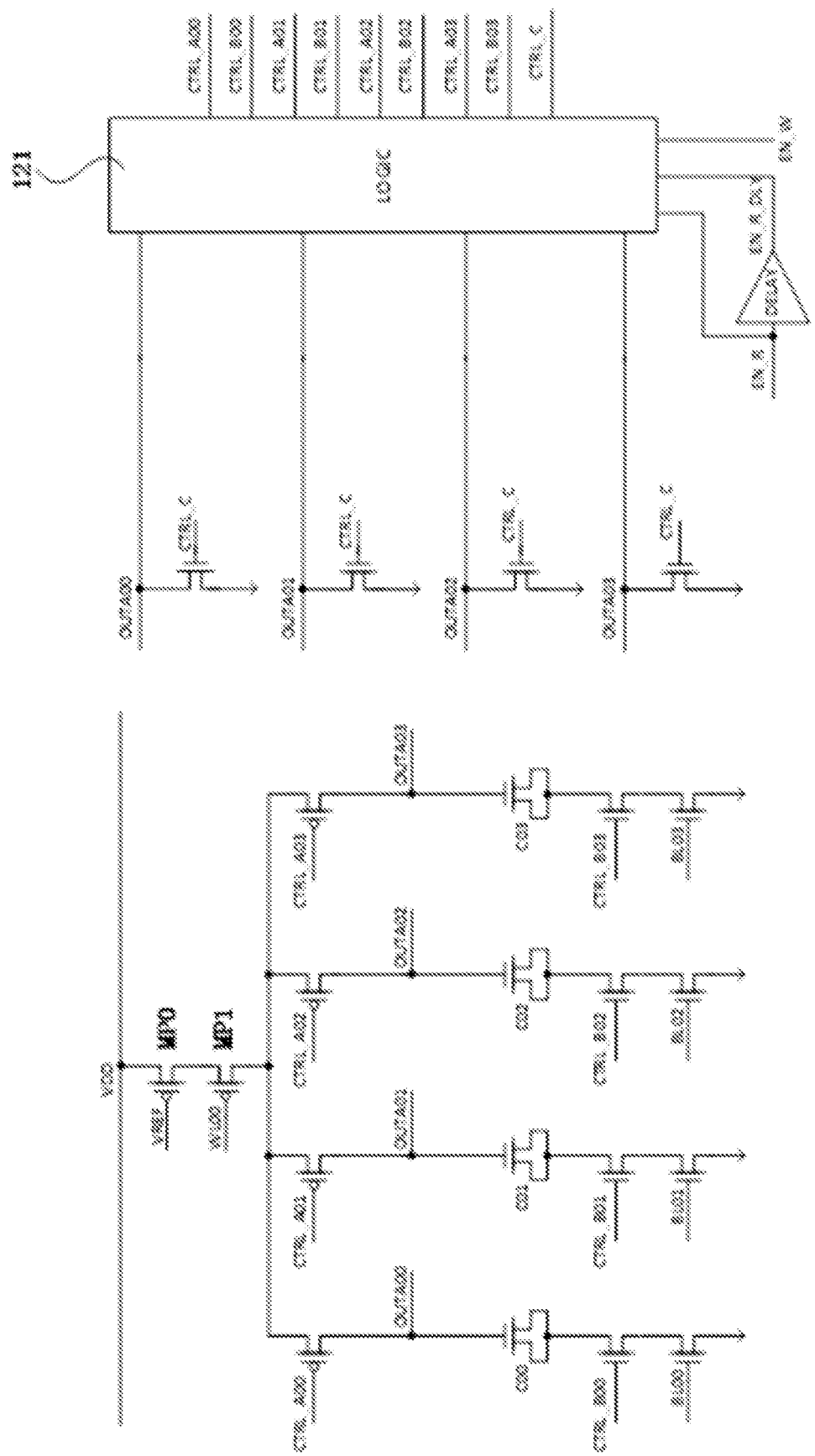
FIG. 3 is a circuit diagram of a second specific embodiment of an anti-fuse memory array circuit.

The present invention also provides a second exemplary implementation of the anti-fuse memory unit array circuit. FIG. 3 is a circuit diagram of a second exemplary embodiment of the anti-fuse memory array circuit. Referring to FIG. 3, the difference between the second embodiment and the first embodiment is that the anti-fuse memory array circuit further includes at least one current supply module MP0, and at least part of the anti-fuse memory unit circuits share the current supply module MP0. For example, all the anti-fuse memory cell circuits share one current supply module MP0. The current supply module MP0 acts as a current mirror to provide current and limit current, and the anti-fuse memory unit circuits share the current supply module MP0 to reduce the number of transistors and thereby reduce the occupying area. In this embodiment, the anti-fuse memory array circuit further includes at least one word line selection unit MP1, and at least part of the anti-fuse memory cell circuits share the word line selection unit MP1, for example, all of the anti-fuse memory cell circuits share the word line selection cell MP1. The word line selection unit MP1 is a selection transistor controlled by a word line, and the word line selection unit MP1 shared by the anti-fuse memory unit circuit can reduce the number of transistors, thereby reducing the area.

Figure 4:
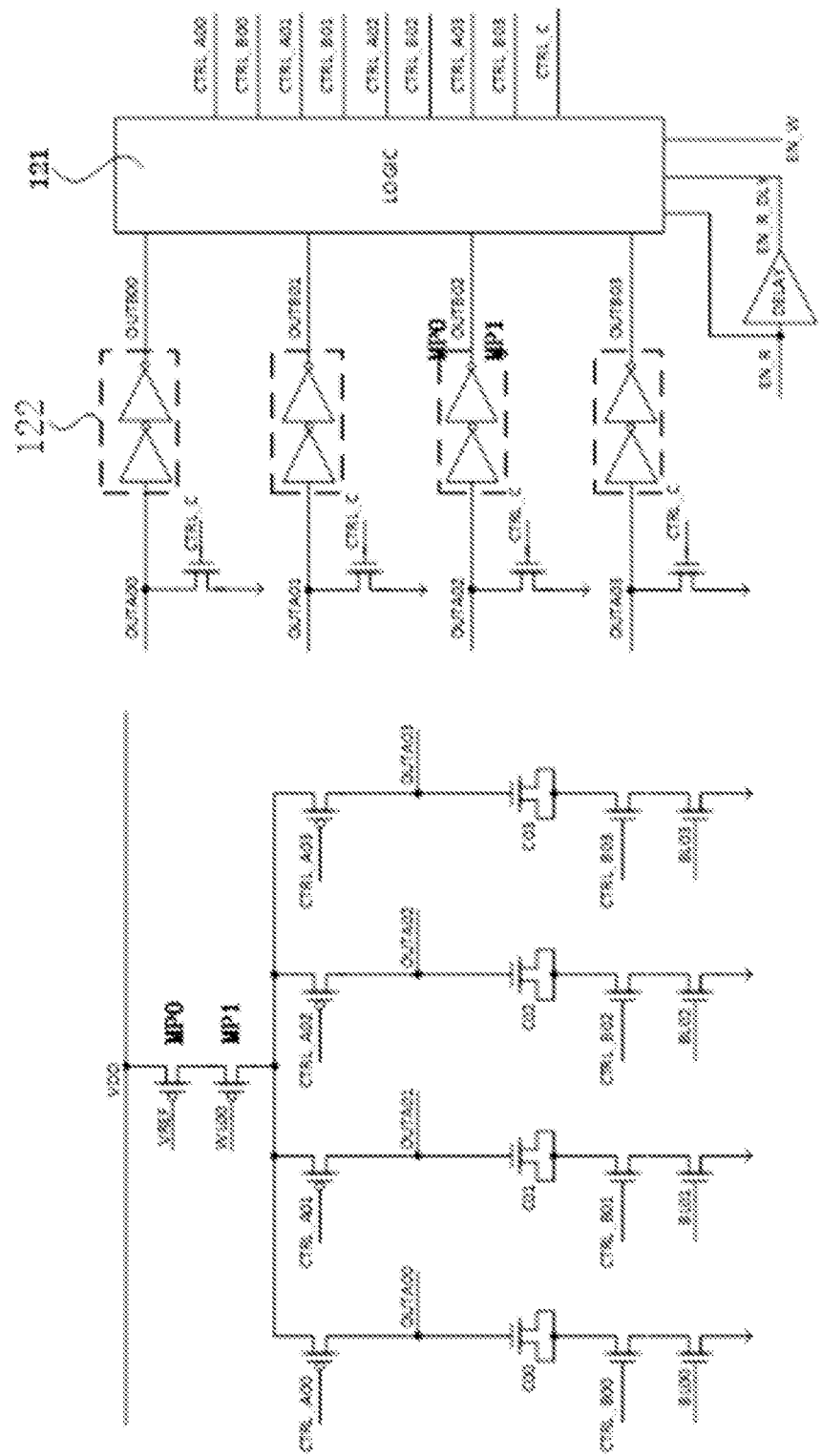
FIG. 4 is a circuit diagram of a third specific embodiment of the anti-fuse memory array circuit.

The invention also provides a third exemplary embodiment of the anti-fuse memory unit array circuit. FIG. 4 is a circuit diagram of a third exemplary embodiment of the anti-fuse memory unit array circuits. Referring to FIG. 4, the difference between the third embodiment and the second embodiment is that the control module includes an amplifying unit 122 which is composed of two inverters, wherein the amplifying unit 122 can be combined with the control unit 121. The circuits are combined to reduce the number of logic gates, thereby reducing the occupying area. In other words, the function of the amplifying unit 122 is realized by the control unit 121.

The above are only the preferred embodiments of the present invention. It should be pointed out for those of ordinary skill in the art, without departing from the principle of the present invention, several improvements and modifications can be made. These improvements and modifications should also be considered the protection scope of the present invention.

The invention claimed is:

1. An anti-fuse memory cell circuit, comprising:
an anti-fuse device;
a switch module, coupled to the anti-fuse device;
a selection module, coupled to the switch module; and
a control module, respectively coupled to the anti-fuse device and the switch module;
wherein, the control module is configured to switch an on-off mode of the switch module according to a breakdown state of the anti-fuse device;
wherein the anti-fuse device has a first end and a second end,
wherein the switch module includes a first switch unit and a second switch unit, wherein each of the first switch unit and the second switch unit has a first terminal, a second terminal and a control terminal, wherein the control terminal is coupled to the control module; and
wherein the second terminals of the first and the second switch units are each coupled to the selection module, wherein the first terminal of the first switch unit is coupled to the first end of the anti-fuse device, and wherein the first terminal of the second switch unit is coupled to the second end of the anti-fuse device.

2. The anti-fuse memory cell circuit according to claim 1, wherein the switch module further comprises a third switch unit, wherein the third switch unit has a first terminal, a second terminal and a control terminal, so the first terminal of the third switch unit is coupled to the first end of the anti-fuse device, wherein the second terminal of the third switch unit is coupled to a ground signal, and the wherein the control terminal of the third switch unit is coupled to the control module.

3. The anti-fuse memory cell circuit of claim 1, wherein the selection module comprises a bit line selection unit and a word line selection unit, wherein the bit line selection unit and the word line selection unit each has a first terminal, a second terminal and a control terminal; wherein the control terminal of the bit line selection unit is coupled to a bit line, the first terminal of the bit line selection unit is coupled to the second terminal of the second switch unit, the second terminal of the bit line selection unit is coupled to a ground signal, wherein the control terminal of the word line selection unit is coupled to a word line, wherein the first terminal of the word line selection unit is coupled to the first switch unit, and wherein the second end terminal of the word line selection unit is coupled to the power signal.

4. The anti-fuse memory cell circuit of claim 3, wherein the anti-fuse memory cell circuit further comprises a current supply module having a first end and a second end, wherein the first end of the current supply module is coupled to the power signal, and the second end of the current supply module is coupled to the second terminal of the word line selection unit.

5. The anti-fuse memory cell circuit of claim 1, wherein the control module comprises a control unit, wherein the control unit has an input end and an output end, and wherein the input end is coupled to the first terminal of the anti-fuse device, a write enable signal, a read enable signal, and a read enable delay signal, and wherein the output end of the control unit is coupled to the switch module.

6. The anti-fuse memory cell circuit of claim 5, wherein the control module further comprises an amplifying unit, the amplifying unit having an input terminal and an output terminal, the input terminal is coupled to the first terminal of the anti-fuse device, the output terminal is coupled to the input terminal of the control unit, and the amplifying unit is used for amplifying the signal of the first terminal of the anti-fuse device.

7. The anti-fuse memory cell circuit of claim 5, wherein the control module further comprises a delay unit, wherein the delay unit has an input terminal and an output terminal, wherein the read enable signal is also coupled to the input end of the delay unit, the output end of the delay unit is coupled to the control unit, and wherein the delay unit is used to delay the read enable signal to form the read enable delay signal.

8. An anti-fuse memory array circuit, comprising:
at least one control module;
a plurality of anti-fuse memory cell circuits, wherein each of the plurality of anti-fuse memory cell circuits comprises:
an anti-fuse device;
a switch module, coupled to the anti-fuse device;
a selection module, coupled to the switch module; and
a control module coupled respectively to the anti-fuse device and the switch module of each of the plurality of anti-fuse memory cell circuits, wherein the control module is configured to switch the on-off mode of the switch module according to the breakdown state of the anti-fuse device;
wherein the control module is a master control module, which is respectively coupled to the anti-fuse device of each of the plurality of anti-fuse memory cell circuits and the switch module;
wherein the master control module comprises a control unit, wherein the control unit has an input terminal and an output terminal, wherein the input terminal of the control unit is respectively coupled to the first end of the anti-fuse device of each of the plurality of the anti-fuse memory cell circuits, a write enable signal, a read enable signal, and a read enable delay signal of each of the plurality of anti-fuse memory cell circuits; and
wherein the output terminal of the control unit is respectively coupled to the switch module of each of the plurality of anti-fuse memory cell circuits.

9. The anti-fuse memory array circuit of claim 8, wherein the plurality of anti-fuse memory cell circuit comprises a plurality of the control modules, wherein each of the control modules is coupled to one anti-fuse device of one of the plurality of anti-fuse memory cell circuits and the switch module of one of the plurality of anti-fuse memory cell circuits.

10. The anti-fuse memory array circuit of claim 8, wherein the plurality of the anti-fuse memory array circuits further comprises at least one current supply module, and wherein at least some of the plurality of anti-fuse memory cell circuits share a same current supply module.

11. The anti-fuse memory array circuit of claim 8, wherein the plurality of anti-fuse memory array circuit further comprises at least one word line selection unit, and at least some of the plurality of anti-fuse memory cell circuits share a same word line selection unit.

12. A method for reading and writing an anti-fuse memory cell circuit, wherein the anti-fuse memory cell circuit comprises:
an anti-fuse device;
a switch module, coupled to the anti-fuse device;
a selection module, coupled to the switch module; and
a control module, respectively coupled to the anti-fuse device and the switch module;
wherein, the control module is configured to switch an on-off mode of the switch module according to a breakdown state of the anti-fuse device,
wherein the method comprises:
during programming, the control module controls the switch module to be in a first state to perform a write operation on the anti-fuse device;
in standby time, the control module controls the switch module to be in a second state to reduce the power consumption of the anti-fuse device; and
during normal operation, the control module controls the switch module to be in a third state to perform a read operation on the anti-fuse device.

13. The method of reading and writing according to claim 12, wherein the selection module is opened during the programming, the selection module is closed during the standby time, and the selection module is opened during the normal operation.

14. The method of reading and writing according to claim 12, wherein the anti-fuse device has a first end and a second end, the switch module includes a first switch unit and a second switch unit, and the first switch unit and the second switch unit each has a first terminal, a second terminal and a control terminal, wherein the control terminal is coupled to the control module, wherein the second terminal is coupled to the selection module, wherein the first terminal of the first switch unit is coupled to the first end of the anti-fuse device, and the first terminal of the second switch unit is coupled to the second end of the anti-fuse device;
wherein the first state of the switch module is when the first switch unit and the second switch unit are open;
wherein the second state of the switch module is when the first switch unit and the second switch unit are off; and
wherein the third state of the switch module is when the first switch unit is turned on and the second switch unit is turned off, if the anti-fuse device is not broken down; and when the first switch unit is closed, and the second switch unit is opened, if the anti-fuse device is broken down.

15. The method of reading and writing according to claim 14, wherein the switch module further comprises a third switch unit, wherein the third switch unit has a first terminal, a second terminal and a control terminal, wherein the first terminal of the third switch unit is coupled to the first end of the anti-fuse device, wherein the second end of the third switch unit is coupled to the ground signal, and wherein the control terminal of the third switch unit is coupled to the control module;
wherein the first state of the switch module is when the first switch unit and the second switch unit are open, and the third switch unit is closed;
wherein the second state of the switch module is when the first switch unit and the second switch unit are closed, and the third switch unit is open; and
wherein the third state of the switch module is, if the anti-fuse device is not broken down, the control module controls the first switch unit to turn on and the second switch unit to turn off, and the third switch unit closed; and if the anti-fuse device is broken down, the control module controls the first switching unit to close, the second switching unit to open, and the third switching unit to close.

* * * * *